(12) United States Patent
Vizcara et al.

(10) Patent No.: US 6,741,088 B2
(45) Date of Patent: May 25, 2004

(54) SEMICONDUCTOR TESTING DEVICE HAVING A NEST WITH A DETACHABLE ANVIL

(75) Inventors: Monica B. Vizcara, Baguio (PH); Albert S. Hagad, Baguio (PH); Jun Panayo, Benguet (PH)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 09/782,093

(22) Filed: Feb. 12, 2001

(65) Prior Publication Data

US 2002/0109515 A1 Aug. 15, 2002

(51) Int. Cl.$^7$ ............................................... G01R 31/00
(52) U.S. Cl. ........................................ 324/755; 324/765
(58) Field of Search ................................ 324/755, 754, 324/761, 762, 765; 439/66.7, 71–90

(56) References Cited

U.S. PATENT DOCUMENTS

| | | | | |
|---|---|---|---|---|
| 4,962,356 A | * | 10/1990 | Eberlein et al. | ........... 324/72.5 |
| 5,245,277 A | * | 9/1993 | Nguyen | ..................... 324/755 |
| 5,926,027 A | * | 7/1999 | Bumb, Jr. et al. | .......... 324/755 |

* cited by examiner

*Primary Examiner*—Vinh P. Nguyen
(74) *Attorney, Agent, or Firm*—Yingsheng Tung; Wade James Brady, III; Frederick J. Telecky, Jr.

(57) ABSTRACT

A semiconductor testing device having a nest for holding an integrated circuit during testing. The nest comprises a plate having a front side and a back side, a cavity in the plate for receiving an integrated circuit having a plurality of pins, a channel for receiving therein an anvil, and an anvil detachably engaged within the channel, positioned to engage the pins of the integrated circuit and to maintain the pins in alignment.

16 Claims, 3 Drawing Sheets

SEMICONDUCTOR TESTING DEVICE HAVING A NEST WITH A DETACHABLE ANVIL

TECHNICAL FIELD OF THE INVENTION

This invention relates to semiconductor testing devices and more particularly to a testing device having a nest with a detachable anvil for testing integrated circuits.

BACKGROUND OF THE INVENTION

Advances in semiconductor technology have necessitated testing devices and methods which are costly and require complicated maintenance procedures. Tests are performed at the different phases of the production of integrated circuits, including the back end of production that results in the packaged integrated circuit. Test equipment must be carefully designed to adequately test integrated circuits while producing as little stress or damage to the integrated circuit as possible. This is particularly true for those parts of the test equipment which come into direct contact with the packaged integrated circuits, especially the pins of the packaged integrated circuits.

Some tests that are performed on packaged integrated circuits require bringing the delicate pins of the packaged integrated circuit into contact with the test equipment by applying pressure to the pins to ensure that a closed circuit is formed between the packaged integrated circuit and the test equipment. Test fixtures in which the packaged integrated circuit is seated and which provide the pressure necessary to produce contact between the pins and the test equipment are well known in the art. The fixture must be kept in good condition, however, to prevent damage to the pins. As the fixture is subjected to repeated test cycling, portions of the fixture, particularly the portions that contact the device pins, become worn and must be replaced. This generally results in gross scrappage because the fixture must be scrapped when the pressure producing portion of the fixture becomes damaged, broken, or cut. It is costly to replace the entire fixture and the cost represented by the resulting scrap is extremely high. Thus, what is needed is a simple and cost efficient method of replacing the portion of the fixture that comes into direct contact with the pins of the packaged integrated circuit.

SUMMARY OF THE INVENTION

These and other problems are generally solved or circumvented, and technical advantages are generally achieved, by the present invention which is a testing device for testing integrated circuits. One aspect of the present invention provides for a nest for holding an integrated circuit during testing. The nest comprises a plate having a front side and a back side, a cavity in the plate for receiving an integrated circuit having a plurality of pins, a channel for receiving therein an anvil, and an anvil detachably engaged within the channel. The anvil is positioned to engage the pins of the integrated circuit and maintain the pins in alignment.

In another aspect the invention provides for a system for testing an integrated circuit comprising a test head having at least one contact point, a handler for placing the integrated circuit in a position for testing and a nest connected to the handler for holding an integrated circuit during testing. The nest comprises a plate having a front side and a back side, a cavity in the plate for receiving an integrated circuit having a plurality of pins, a channel for receiving therein an anvil, and an anvil detachably engaged within the channel. The anvil is positioned to engage the pins of the integrated circuit and maintain the pins in alignment.

One advantage of an embodiment of the present invention is that it reduces the amount of scrap produced from having to replace a damaged device which comes into contact with the pins of the packaged integrated circuit.

Another advantage of an embodiment of the present invention is that costs are reduced because only the portion of the test fixture which directly comes into contact with the pins of the packaged integrated circuit is replaced.

Yet another advantage of an embodiment of the present invention is that it prevents early wear out of the entire test fixture.

A further advantage of an embodiment of the present invention is that it is more environmentally friendly by producing less scrap.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTIONS OF THE DRAWINGS

DETAILED DESCRIPTION OF THE PRESENT INVENTION

Figure 1:
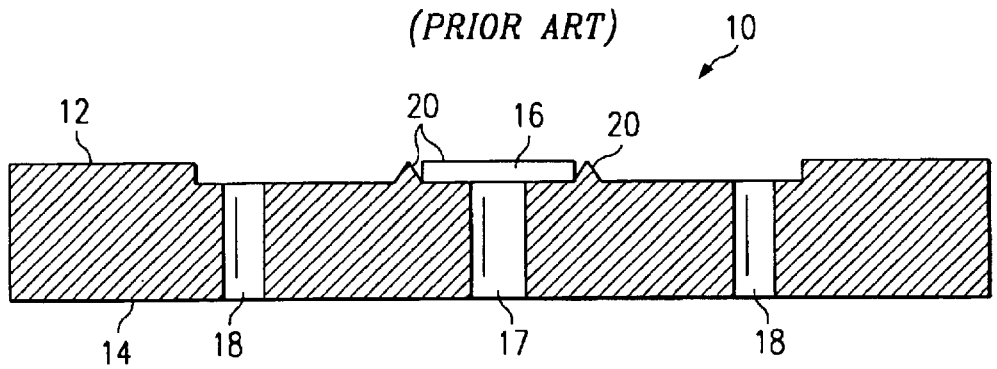
FIG. 1 is a side view of a prior art fixture used to test packaged integrated circuits.

FIG. 1 illustrates a prior art fixture 10 used to test packaged integrated circuits. The fixture 10 includes a front side 12, a back side 14, a cavity 16, and an orifice 17. The cavity 16 provides for the seating of the packaged integrated circuit during the applicable testing procedure. The orifice 17 is utilized to seat the packaged integrated circuit into the cavity 16. The fixture 10 further includes two off-centered orifices 18 which are utilized to connect the fixture 10 to a handler (not shown). The anvil 20 is an integrally formed projection within the fixture located at the front side 12. During the testing procedure, the packaged integrated circuit is seated in the cavity 16 and the anvil 20 will sandwich the leads of the packaged integrated circuit against a contact point on the test head ensuring a good contact.

Figure 2:
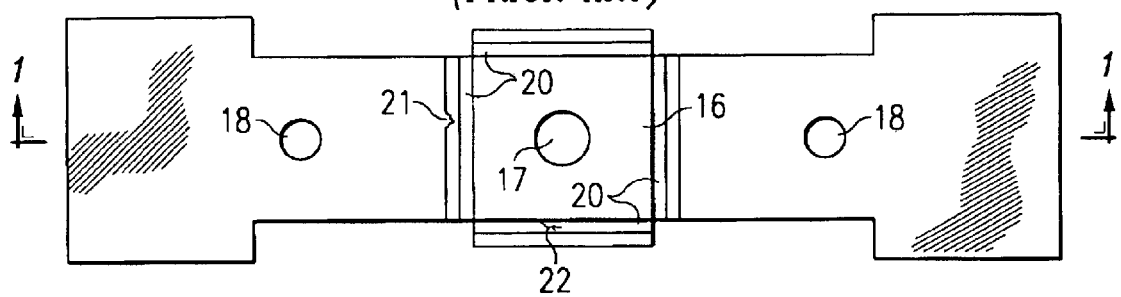
FIG. 2 is a top view of a damaged prior art fixture.

While the prior art fixture 10 provides the necessary contact between the pins of the integrated circuit and the test equipment, the prior art has various disadvantages including early wear out. The anvil 20 is subject to damage including cuts 21, cracks 22, and deep pin imprints. The cuts 21 and cracks 22 are illustrated in FIG. 2. Cuts 21 and cracks 22 result from repeated contact with the pins of the device under test. Deep pin imprints result from continuous pressure exerted on the same points of the anvil 20. Cuts 21, cracks, and deep lead imprints in the anvil 20 will result in the fixture 10 being replaced since these imperfections will damage the pins of the integrated circuit. Because the anvil 20 is integrally formed within the fixture 10, damage to the anvil 20 results in the entire fixture 10 being scrapped.

Figure 3:
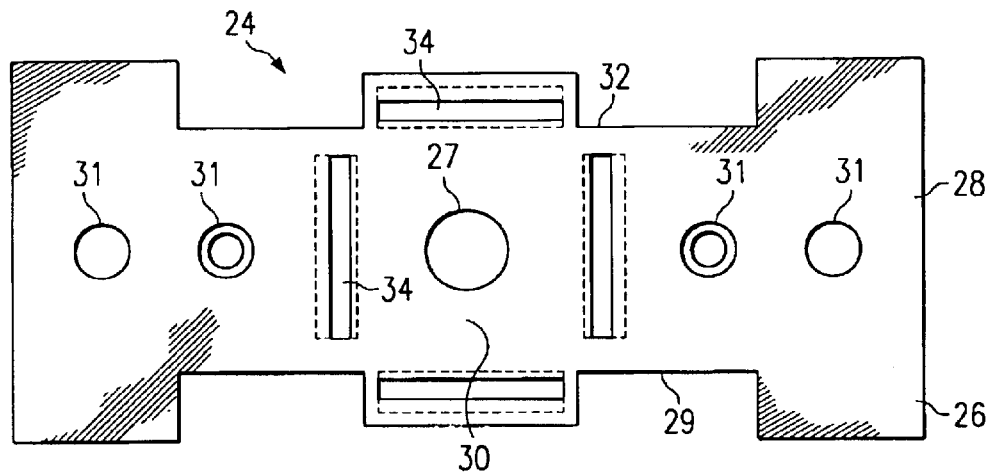
FIG. 3 is a top view of a preferred embodiment of the present invention.

The preferred embodiment of the present invention provides a fixture that can be used to provide contact between the pins of the integrated circuit and the test equipment. However, the present invention provides for a detachable anvil which can be changed when the anvil becomes damaged. A top view of the preferred embodiment is shown in FIG. 3.

The preferred embodiment of the present invention includes a nest 24 comprising a plate 26 and one or more detachable anvils 34. The plate 26 is made of any suitably durable material in order to withstand repeated testing procedures, but is preferably steel, aluminum, or Torlon®. Torlon® is a non-conductive material that is able to withstand exposure to high temperatures, thus quite suitable for use in the present invention. The nest 24 further comprises a plurality of attachment orifices 31 within the plate 26 which are utilized to attach the nest 24 to a handler 40 (shown in FIG. 4) or other test equipment.

The plate 26 includes a front side 28, a back side 29, a cavity 30, an orifice 27, and a channel 32. The cavity 30 is designed to receive the integrated circuit for seating during the testing procedure. The cavity 30 will have the same shape as the integrated circuit to be tested. The orifice 27 extends from the front side 28 of the plate 26 to the back side 29 of the plate 26 resulting in a region through which a means for positioning and/or securing the integrated circuit is interfaced.

Figure 4:
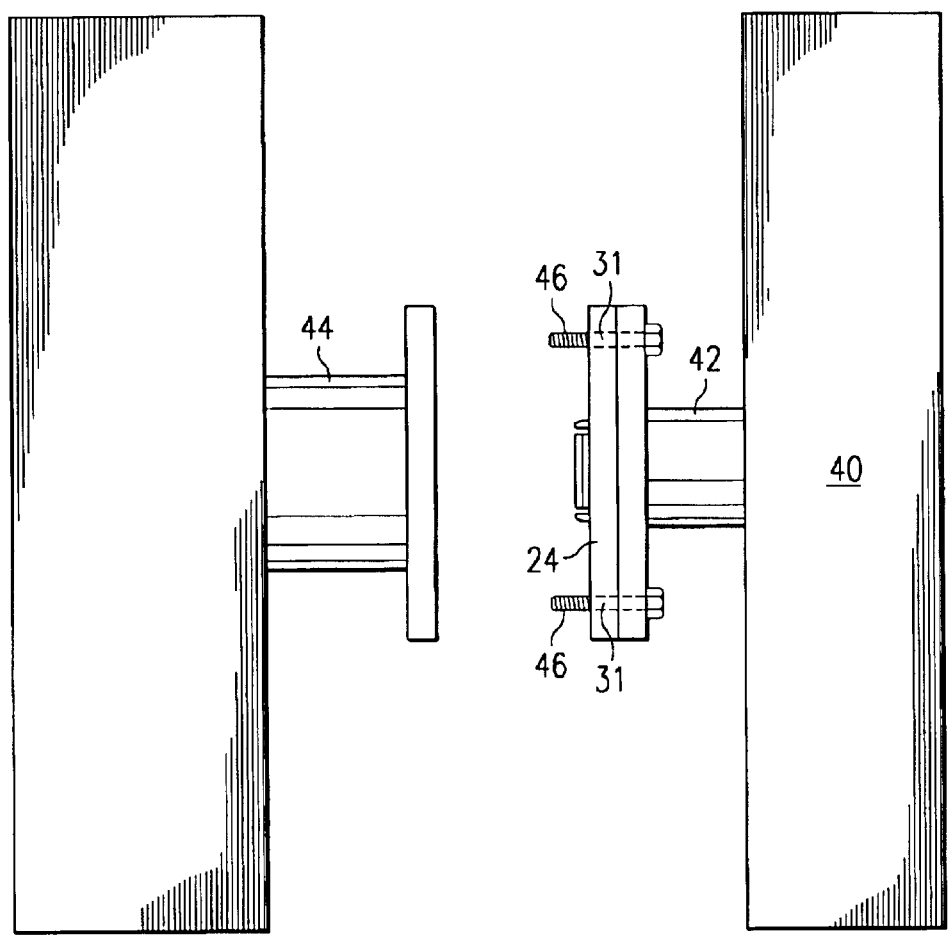
FIG. 4 illustrates a handler in which a preferred embodiment of the invention operates.

In the preferred embodiment shown in FIG. 4, the nest 24 is attached to a chuck assembly 42 which is part of the handler 40. A series of screws 46 which pass through the plurality of attachment orifices 31 fasten the nest 24 to the chuck assembly 42. It should be appreciated by those skilled in the art that other means for attaching the nest 24 to the handler may be implemented. For example, a dowel that fits through the attachment orifices 31 can be used as well as a clamping mechanism.

The means for positioning and/or securing the integrated circuit can be a vacuum device (not shown). The vacuum device comprises a vacuum cap substantially circular in shape and whose diameter is determined by the radius of the orifice 27 to provide secure attachment of the vacuum device within the orifice 27. The vacuum device will seat the integrated circuit into the cavity 30 by suctioning the integrated circuit into contact with the front surface 28. The integrated circuit can then be placed in a position to be tested with a test head 44. The test head 44 contains conductive elements that provide an electrical path for testing of the integrated circuit. It should be appreciated that the orifice 27 can be of any shape that corresponds to the shape of the vacuum device or any shape that facilitates positioning the packaged integrated circuit within the nest 24.

Figure 5:
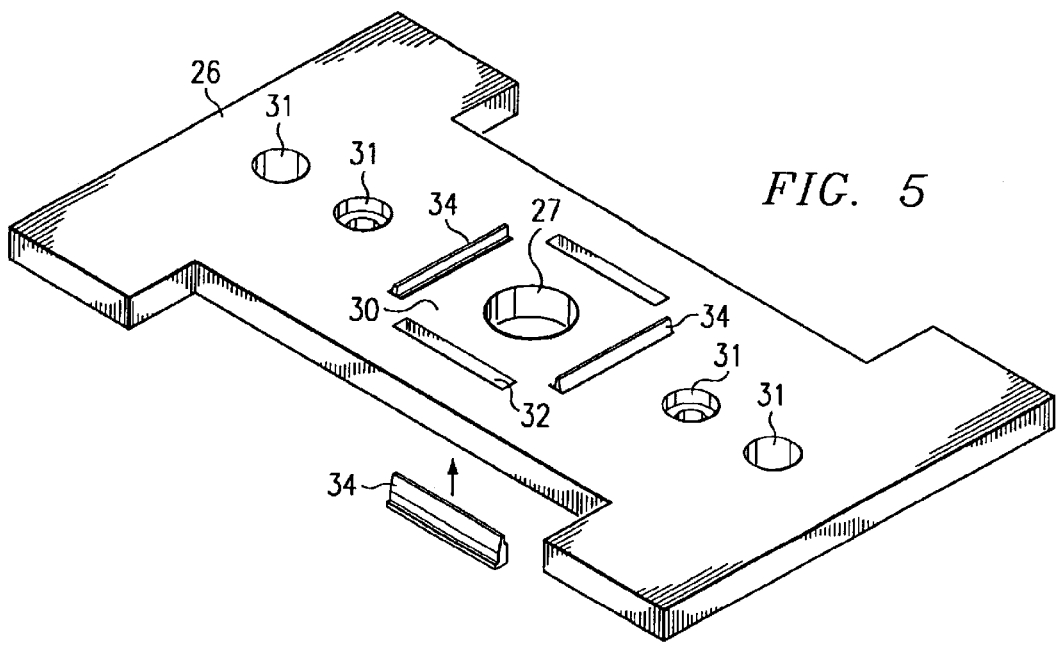
FIG. 5 is a three dimensional view of a preferred embodiment of the present invention.

As shown in FIG. 5, the channel 32 is formed within the plate 26. The length of the channel 32 is determined by the length of the anvil 34 that is seated into the channel 32. The shape of the channel 32 is chosen to suitably work with the anvil 34. As shown in the preferred embodiment, there are actually four channels 32, each channel 32 corresponding to one side of the integrated circuit to be tested.

Figure 6:
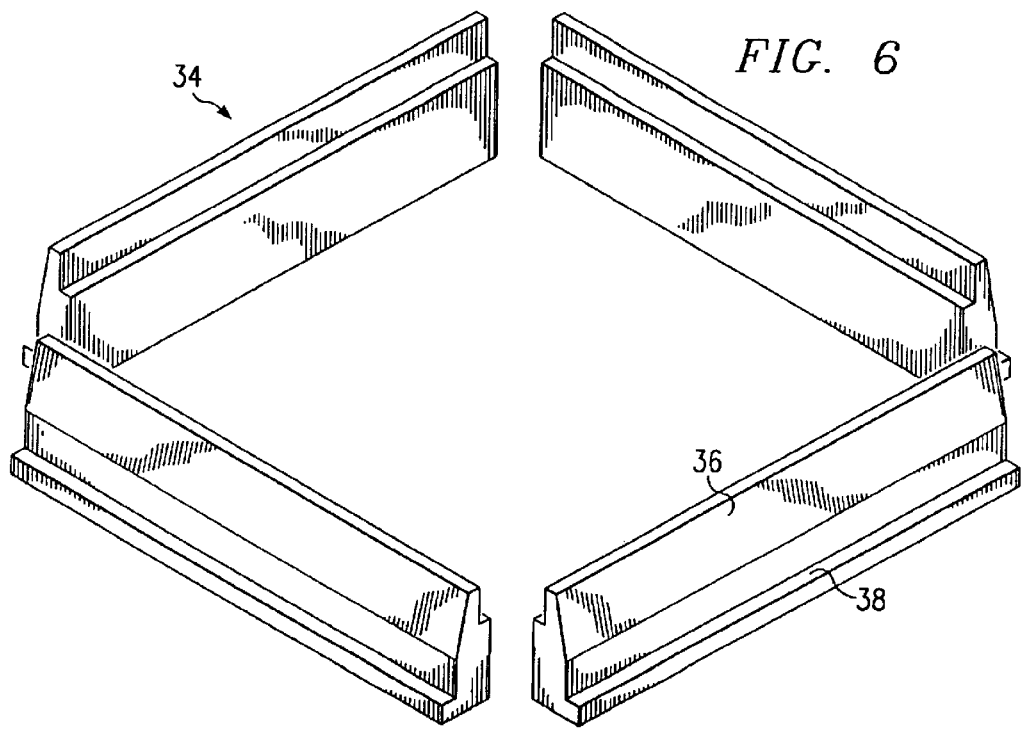
FIG. 6 illustrates the detachable anvil of a preferred embodiment of the present invention.

The anvil 34 is a detachable member that is seated within the channel 32. In the preferred embodiment of the present invention, which is designed to be used with Quad flat packages (QFP), there are four anvils 34 which are positioned at each of the four sides of the QFP. Each anvil 34 is positioned to engage the pins of the integrated circuit and to maintain the pins in alignment. The anvil 34, as illustrated in FIG. 6, is generally L-shaped having a first leg 36 with a second leg 38 oriented substantially at a right angle thereto. The first leg 36 is designed to slide into the channel 32 and the second leg 38 extends above the back side 29 of the plate 26. The extension of the second leg 38 above the back side 29 ensures that the anvil 34 is correctly positioned in the channel 32. The anvil 34 are secured in place when the nest 24 is attached to the handler 40. It should be appreciated by those skilled in the art that the anvil may be secured utilizing screws, clamps, pins, or springs and the like. The first leg 36 will come into direct contact with the pins of the packaged integrated circuit to ensure a proper contact between the circuit and the test equipment. The anvil 34 is made of a non-conductive, non-corrosive, and frictionless material suitable for use in the semiconductor fabrication environment. The material may be, but is not limited to Torlon® or Vespel®. It should be understood that the preferred embodiment of the present invention may also be designed to be used with other package types such as Ball Grid Array packages (BGA), pin grid array, surface mount packages, and the like.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A nest for holding an integrated circuit during testing, comprising:
    a plate having a front side and a back side;
    an area on said front side of the plate for receiving an integrated circuit having a plurality of pins;
    a channel through the plate for receiving therethrough an anvil, said channel adjacent said area on said front side; and
    an anvil detachably engaged through the channel, positioned to engage the pins of the integrated circuit and to maintain the pins in alignment.

2. The nest of claim 1 wherein the plate comprises a material selected from the group consisting of aluminum, steel, or non-conductive high temperature material.

3. The nest of claim 1 wherein the nest is designed to seat a Quad Flat Pack packaged integrated circuit.

4. The nest of claim 1 wherein the anvil comprises a non-conductive, non-corrosive, frictionless material.

5. The nest of claim 1 wherein the anvil comprises a non-conductive high temperature material.

6. A system for testing an integrated circuit comprising:
    a test head having at least one contact point;
    a handler for placing the integrated circuit in a position for testing; and
    a nest connected to the handler for holding an integrated circuit during testing, comprising:

a plate having a front side and a back side, an area on said front side of the plate for receiving an integrated circuit having a plurality of pins;

a channel through the plate for receiving therethrough an anvil, said channel adjacent said area on said front side; and an anvil detachably engaged through the channel, positioned to engage the pins of the integrated circuit and to maintain the pins in alignment.

7. The system of claim 6 wherein the anvil is slidably attached within the channel.

8. The system of claim 6 wherein the anvil is comprised of a non-conductive, non-corrosive, frictionless material.

9. The system of claim 8 wherein the anvil comprises a non-conductive high temperature material.

10. The system of claim 6 wherein the plate comprises a material selected from the group consisting of aluminum, steel, or non-conductive high temperature material.

11. The system of claim 6 wherein the nest further comprises a means for connecting the nest to the handler.

12. The system of claim 11 wherein the means for connecting are screws.

13. The nest of claim 6 wherein the nest is designed to seat a Quad Flat Pack (QFP) packaged integrated circuit.

14. A test apparatus comprising:

a test head having at least one contact point;

a nest adapted to hold an integrated circuit such that at least one lead on said integrated circuit can be touched by said test head contact point when said test head and said nest are juxtaposed during operation of said test apparatus, said nest comprising:

a plate;

an area on said plate adapted to receive said integrated circuit;

a channel through said plate adjacent said area on said plate in a location adjacent said test head contact point when said test head and said nest are juxtaposed; and an anvil releasably disposed in said channel to provide force sufficient to press said lead on said integrated circuit against said test head contact point during juxtaposition of said test head and said nest.

15. The test apparatus of claim 14 wherein said plate has front and back surfaces, said area on said plate being on said front surface, wherein said front surface faces said test head during juxtaposition of said test head and said nest, and further wherein said anvil is inserted into said channel from said back surface of said plate.

16. The test apparatus of claim 14 further comprising a handler onto which said nest is mounted, said anvil held in place in said nest by the juxtaposition of said nest on said handler.

* * * * *